United States Patent
Lin et al.

(10) Patent No.: US 11,527,884 B2
(45) Date of Patent: Dec. 13, 2022

(54) PROTECTION CIRCUIT

(71) Applicant: Vanguard International Semiconductor Corporation, Hsinchu (TW)

(72) Inventors: Chih-Hsuan Lin, Hsinchu (TW); Shao-Chang Huang, Hsinchu (TW); Yeh-Ning Jou, Hsinchu (TW); Hwa-Chyi Chiou, Hsinchu (TW); Ching-Ho Li, Hsinchu (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 3 days.

(21) Appl. No.: 17/194,468

(22) Filed: Mar. 8, 2021

(65) Prior Publication Data
US 2022/0285932 A1   Sep. 8, 2022

(51) Int. Cl.
*H02H 9/00* (2006.01)
*H02H 9/04* (2006.01)
(Continued)

(52) U.S. Cl.
CPC ......... *H02H 9/005* (2013.01); *H01L 27/0248* (2013.01); *H02H 3/20* (2013.01);
(Continued)

(58) Field of Classification Search
CPC .. H02H 3/22; H02H 9/04; H02H 3/20; H02H 3/02; H02H 9/06; H02H 9/046;
(Continued)

(56) References Cited

U.S. PATENT DOCUMENTS

| 7,911,752 B1 * | 3/2011 | Lin | H02H 9/046 |
| | | | 361/56 |
| 9,025,289 B1 * | 5/2015 | Peng | H02H 9/046 |
| | | | 361/118 |

(Continued)

FOREIGN PATENT DOCUMENTS

| TW | 201633505 A | 9/2016 |
| TW | 201818527 A | 5/2018 |
| TW | 201947730 A | 12/2019 |

OTHER PUBLICATIONS

Office Action for Taiwanese Application No. 109123681, dated Oct. 6, 2020.

*Primary Examiner* — Danny Nguyen
(74) *Attorney, Agent, or Firm* — Birch, Stewart, Kolasch & Birch, LLP

(57) ABSTRACT

A protection circuit including a detection circuit, a current discharge element, a first transistor, and a second transistor is provided. The detection circuit is coupled between a first pad and a second pad to detect ESD events. In response to an ESD event, the detection circuit sets the detection signal to a predetermined level. The current discharge element is coupled between the first and second pads. In response to the detection signal being at the predetermined level, the current discharge element is turned on so that the ESD current passes through the current discharge element. The first transistor is coupled between a core circuit and the second pad. The second transistor is coupled between the first transistor and the second pad. In response to the detection signal being at the predetermined level, the second transistor is turned on to turn off the first transistor.

18 Claims, 5 Drawing Sheets

(51) Int. Cl.
*H01L 27/02* (2006.01)
*H02H 3/20* (2006.01)

(52) U.S. Cl.
CPC ............... *H02H 9/00* (2013.01); *H02H 9/04* (2013.01); *H02H 9/046* (2013.01); *H01L 27/0266* (2013.01)

(58) Field of Classification Search
CPC .......... H02H 11/003; H02H 9/00; H05K 9/00; H05K 1/02; H05K 9/0067; H05K 9/0079; H03K 19/003; H03K 19/00346; H01L 27/0255; H01L 27/02; H01L 27/0248; H01L 27/0266; H01L 27/0262
USPC ........................................................... 361/56
See application file for complete search history.

(56) References Cited

U.S. PATENT DOCUMENTS

| | | | | |
|---|---|---|---|---|
| 10,861,845 | B2* | 12/2020 | Salcedo | ............... H01L 27/0262 |
| 2011/0063762 | A1* | 3/2011 | Lee | ........................ H02H 9/046 |
| | | | | 361/56 |
| 2015/0342098 | A1* | 11/2015 | Lai | ................... H03K 19/00346 |
| | | | | 361/56 |
| 2018/0159323 | A1* | 6/2018 | Huang | ................... H02H 9/046 |

* cited by examiner

PROTECTION CIRCUIT

BACKGROUND OF THE INVENTION

Field of the Invention

The invention relates to a protection circuit, and more particularly to a protection circuit that prevents an electrostatic discharge (ESD) current from entering a core circuit.

Description of the Related Art

As the semiconductor manufacturing process develops, an electrostatic discharge (ESD) protection has become one of the most critical reliability issues for integrated circuits (IC). In particular, as semiconductor process advances into the deep sub-micron stage, scaled-down devices and thinner gate oxides are more vulnerable to ESD stress. Generally, the input/output pins on IC chips should sustain at least 2 kVolt ESD stress of high Human Body Mode (HBM) or 200 Volt of Machine Mode. Thus, the input/output pins on IC chips are usually designed to include ESD protect devices or circuits for protecting the core circuit in IC chips from ESD damage.

BRIEF SUMMARY OF THE INVENTION

In accordance with an embodiment of the disclosure, a protection circuit for preventing an electrostatic discharge (ESD) current from entering a core circuit comprises a detection circuit, a current discharge element, a first transistor, and a second transistor. The detection circuit is coupled between a first pad and a second pad to detect ESD events. In response to an ESD event, the detection circuit sets the detection signal to a predetermined level. The current discharge element is coupled between the first and second pads. In response to the detection signal being at the predetermined level, the current discharge element is turned on so that the ESD current passes through the current discharge element. The first transistor is coupled between the core circuit and the second pad. The second transistor is coupled between the first transistor and the second pad. In response to the detection signal being at the predetermined level, the second transistor is turned on to turn off the first transistor.

In accordance with another embodiment of the disclosure, an operation circuit comprises a core circuit and a protection circuit. The core circuit is coupled to a first pad. The protection circuit prevents an electrostatic discharge (ESD) current from entering the core circuit and comprises a detection circuit, a current discharge element, a first transistor, and a second transistor. The detection circuit is coupled between a first pad and a second pad to detect ESD events. In response to an ESD event, the detection circuit sets the detection signal to a predetermined level. The current discharge element is coupled between the first and second pads. In response to the detection signal being at the predetermined level, the current discharge element is turned on so that the ESD current passes through the current discharge element. The first transistor is coupled between the core circuit and the second pad. The second transistor is coupled between the first transistor and the second pad. In response to the detection signal being at the predetermined level, the second transistor is turned on to turn off the first transistor.

BRIEF DESCRIPTION OF THE DRAWINGS

The invention can be more fully understood by referring to the following detailed description and examples with references made to the accompanying drawings, wherein.

DETAILED DESCRIPTION OF THE INVENTION

Figure 1:
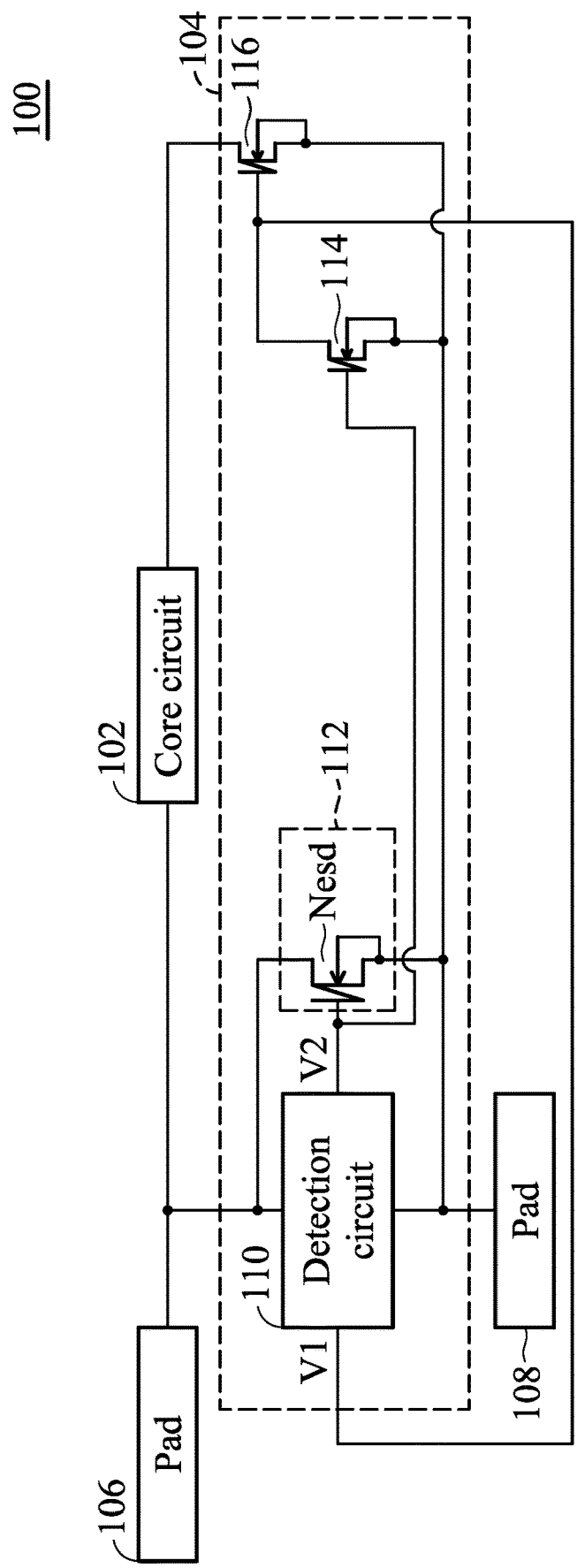
FIG. 1 is a schematic diagram of an exemplary embodiment of an operation circuit according to various aspects of the present disclosure.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated for illustrative purposes and not drawn to scale. The dimensions and the relative dimensions do not correspond to actual dimensions in the practice of the invention.

FIG. 1 is a schematic diagram of an exemplary embodiment of an operation circuit according to various aspects of the present disclosure. The operation circuit 100 comprises a core circuit 102 and a protection circuit 104. The kind of core circuit 102 is not limited in the present disclosure. In one embodiment, the core circuit 102 is a non-volatile memory, such as one-time programmable chip. In other embodiments, the core circuit 102 comprises a plurality of metal fuses, a plurality of poly-fuses, a plurality of metal anti-fuses or a plurality of poly anti-fuses.

The protection circuit 104 is coupled between pads 106 and 108 and configured to determine whether an electrostatic discharge (ESD) event occurs. When an ESD event occurs in the pad 106 and the pad 108 receives a ground voltage, the protection circuit 104 enters a protection mode. In the protection mode, the protection circuit 104 releases an ESD current from the pad 106 to the pad 108 to prevent the ESD current from entering the core circuit 102 from the pad 106. At this time, the protection circuit 104 may direct the core circuit 102 to stop operating. The invention does not limit how the protection circuit 104 directs the core circuit 102 to stop operating. In one embodiment, the protection circuit 104 stop providing an operation voltage (e.g., a ground voltage) to the core circuit 102. In this case, since there is not the operation voltage, the core circuit 102 is not capable of operating.

When the pad 106 receives a first operation voltage (e.g., 5V) and the pad 108 receives a second operation voltage (e.g., 0V), the protection circuit 104 enters a normal mode. In the normal mode (no ESD), the protection circuit 104 activates the core circuit 102 so that the core circuit 102 operates normally. In one embodiment, the protection circuit 104 provides an operation voltage (e.g., a ground voltage) to the core circuit 102 again. In some embodiments, the core circuit 102 may perform a write operation.

In this embodiment, the protection circuit 104 comprises a detection circuit 110, a current discharge element 112, and transistors 114 and 116. The detection circuit 110 is coupled between the pads 106 and 108 to determine whether an ESD occurs. For example, when the voltage of the pad 106 is increased momentarily and the pad 108 is coupled to ground, it means that an ESD event has occurred. Therefore, the detection circuit 110 sets the detection signal V1 to a first predetermined level, which may be a low level or a high level. In some embodiments, when the voltage of the pad 108 is increased momentarily and the pad 106 is coupled to ground, the detection circuit 110 also sets the detection signal V1 to the first predetermined level.

In some embodiments, the detection circuit 110 further generates a control signal V2. When an ESD event occurs, the detection circuit 110 sets the control signal V2 to a second predetermined level, which may be a high level or a low level. In this case, the level of the control signal V2 is opposite the level of the detection signal V1. For example, when the detection signal V1 is at a low level, the control signal V2 is at a high level. In this case, when the detection signal V1 is at a high level, the control signal V2 is at a low level.

The sequence of generating the detection signal V1 and the control signal V2 is not limited in the present disclosure. In one embodiment, the detection circuit 110 first generates the detection signal V1 and then generates the control signal V2. In this case, the detection circuit 110 inverts the detection signal V1 to generate the control signal V2. In another embodiment, the detection circuit 110 first generates the control signal V2 and then generate the detection signal V1. In this case, the detection circuit 110 may invert the control signal V2 to generate the detection signal V1.

The current discharge element 112 is coupled between the pads 106 and 108 and receives the control signal V2. When an ESD event occurs, the detection signal V1 is at a first predetermined level (e.g., a low level). Therefore, the control signal V2 is at a second predetermined level (e.g., a high level). At this time, the current discharge element 112 is turned on to release an ESD current from the pad 106 to the pad 108 or from the pad 108 to the pad 106. In this embodiment, the current discharge element 112 is an N-type transistor Nesd. The gate of the N-type transistor Nesd receives the control signal V2. The drain of the N-type transistor Nesd is coupled to the pad 106. The source of the N-type transistor Nesd is coupled to the pad 108. To accept a high voltage, the size of the channel of the N-type transistor Nesd is larger than the sizes of the channels of the transistors 114 and 116. In other embodiments, the current discharge element 112 is a P-type transistor.

The transistor 116 is coupled between the core circuit 102 and the pad 108. In this embodiment, the transistor 116 is an N-type transistor. The drain (referred to as a first electrode) of the transistor 116 is coupled to the core circuit 102. The source (referred to as a second electrode) of the transistor 116 is coupled to the pad 107. The gate of the transistor 116 is coupled to the transistor 114 and receives the detection signal V1. In one embodiment, when the detection signal V1 is at a first predetermined level (e.g., a low level), it means that an ESD event has occurred. Therefore, the transistor 116 is turned off to de-activate the core circuit 102. In other embodiments, the pad 108 receives a ground voltage in the normal mode (no ESD event). At this time, since the detection signal V1 is not at the first predetermined level, the transistor 116 is turned on to activate the core circuit 102. In one embodiment, the transistor 116 provides the voltage (e.g., a ground voltage) received by the pad 108 to the core circuit 102 so that the core circuit 102 operates normally.

The transistor 114 is coupled between the transistor 116 and the pad 108. When the detection signal V1 is at the first predetermined level, since the control signal V2 is at a second predetermined level, the transistor 114 is turned on to turn off the transistor 116. In one embodiment, when the detection signal V1 is at the first predetermined level, the transistor 114 sets the voltage of the gate of the transistor 116 to equal the voltage (e.g., a ground voltage) of the pad 108.

In this embodiment, the transistor 114 is an N-type transistor. In this case, the drain (referred to as a third electrode) of the transistor 114 is coupled to the gate of the transistor 116. The source (referred to as a fourth electrode) of the transistor 114 is coupled to the pad 108. The gate of the transistor 114 is coupled to the gate of the N-type transistor Nesd. In the normal mode (no ESD event), the pad 108 receives a ground voltage. At this time, since the control signal V2 is not at the second predetermined level, the transistor 114 is turned off.

In some embodiments, when the ESD event occurs, the detection circuit 110 sets the detection signal V1 to the first predetermined level. At this time, although the transistor 116 is turned off, the level of the detection signal V1 may gradually increase due to a leakage current from the detection circuit 110. Therefore, the transistor 116 may be turned on to activate the core circuit 102. At this time, if the ESD current enters the core circuit 102, the core circuit 102 will be damaged. Therefore, when the detection signal V1 is at the first predetermined level, the transistor 114 is turned on to set the voltage of the gate of the transistor 116 to equal the voltage (e.g., a ground voltage) of the pad 108 and prevent the transistor 116 from activating the core circuit 102.

Figure 2:
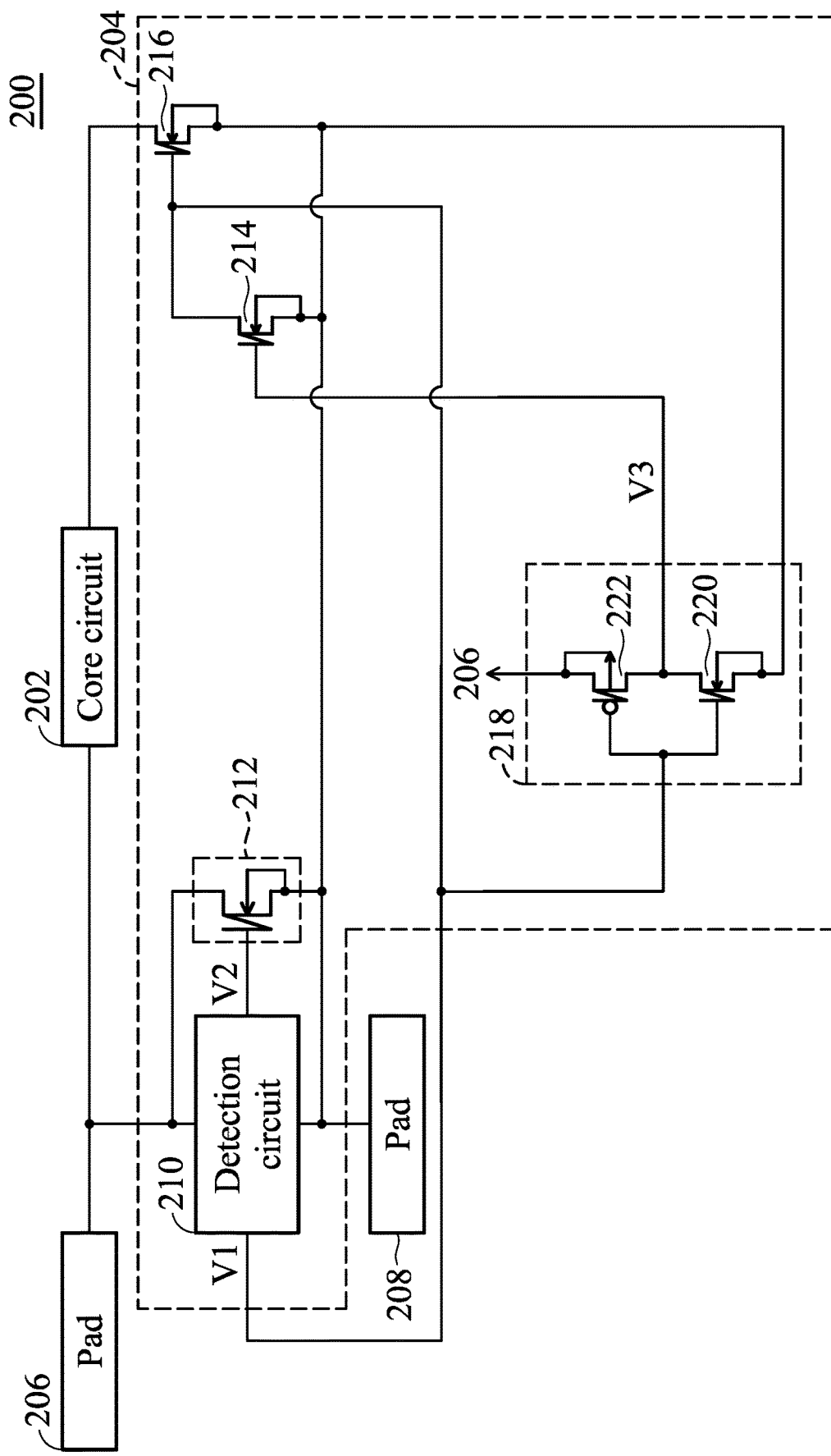
FIG. 2 is a schematic diagram of another exemplary embodiment of the operation circuit according to various aspects of the present disclosure.

FIG. 2 is a schematic diagram of another exemplary embodiment of the operation circuit, according to various aspects of the present disclosure. The operation circuit 200 comprises a core circuit 202 and a protection circuit 204. Since the feature of the core circuit 202 is the same as the feature of the core circuit 102, the description of the feature of the core circuit 202 is omitted. The protection circuit 204 is coupled between the pads 206 and 208. When an ESD event occurs in the pad 206 and the pad 208 is coupled to ground, the protection circuit 204 enters a protection mode. In this mode, the protection circuit 204 releases an ESD current from the pad 206 to the pad 208 and de-activates the core circuit 202. When there is no ESD event, the protection circuit 204 enters a normal mode. In this mode, the protection circuit 204 directs the core circuit 202 to operate normally.

In this embodiment, the protection circuit 204 comprises a detection circuit 210, a current discharge element 212, transistors 214 and 216, and an inverting circuit 218. Since the features of the detection circuit 210, the current discharge element 212, the transistors 214 and 216 are the same as the features of the detection circuit 110, the current discharge element 112, the transistors 114 and 116, the descriptions of the features of the detection circuit 210, the current discharge element 212, the transistors 214 and 216 are omitted.

The inverting circuit 218 is coupled between the pads 206 and 208 and inverts the detection signal V1 to generate a control signal V3. In this embodiment, the level of the control signal V3 is the same as the level of the control signal V2. In this embodiment, the inverting circuit 218 serves as a buffer. Therefore, the driving capability of the control signal V3 is better than the driving capability of the control signal V2. As shown in FIG. 2, the inverting circuit 218 comprises an N-type transistor 220 and a P-type transistor 222.

The source of the P-type transistor 222 is coupled to the pad 206. The drain of the P-type transistor 222 is coupled to the gate of the transistor 214. The gate of the P-type transistor 222 serves as an input terminal of the inverting circuit 218 to receive the detection signal V1. The gate of the N-type transistor 220 is coupled to the pad 208. The drain of the N-type transistor 220 serves as an output terminal of the inverting circuit 218 and coupled to the gate of the transistor 214. The gate of the N-type transistor 220 receives the detection signal V1. When an ESD event occurs, the detection circuit 210 sets the detection signal V1 to the first predetermined level. At this time, the control signal V3 is at the second predetermined level. Therefore, the transistor 214 is turned on to set the voltage of the gate of the transistor 216 to equal to the voltage (e.g., a ground voltage) of the pad 208 to prevent the transistor 216 from activating the core circuit 202. The number of inverting circuit 218 is not limited in the present disclosure. In other embodiments, the protection circuit 204 comprises odd inverting circuits. The inverting circuits are connected in series between the detection circuit 210 and the transistor 214.

Figure 3:
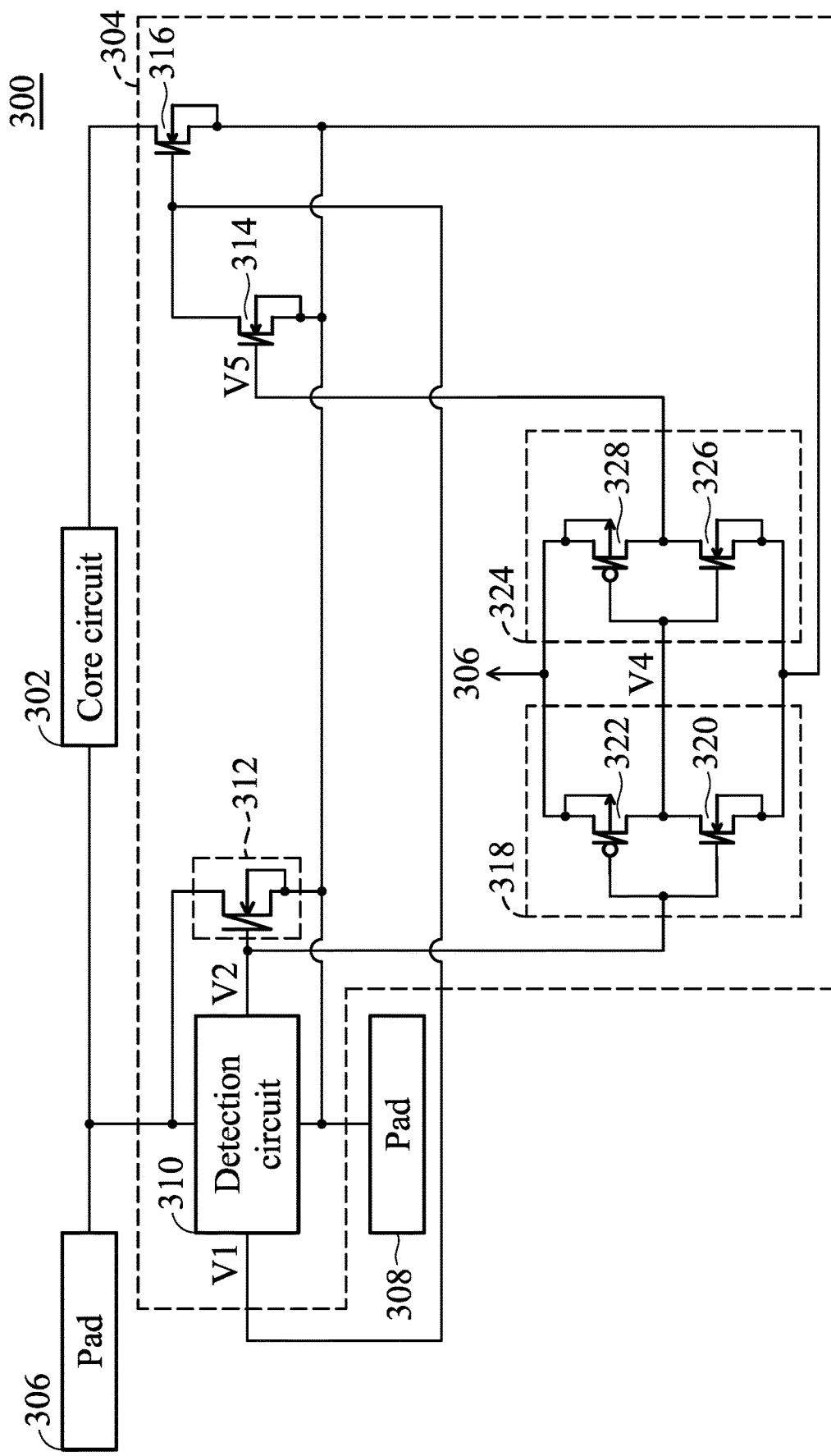
FIG. 3 is a schematic diagram of another exemplary embodiment of the operation circuit according to various aspects of the present disclosure.

FIG. 3 is a schematic diagram of another exemplary embodiment of the operation circuit, according to various aspects of the present disclosure. The operation circuit 300 comprises a core circuit 302 and a protection circuit 304. Since the feature of the core circuit 302 is the same as the feature of the core circuit 102 of FIG. 1, the description of the feature of the core circuit 302 is omitted. The protection circuit 304 is coupled between the pads 306 and 308. When an ESD event occurs in the pad 306 and the pad 308 is coupled to ground, the protection circuit 304 enters a protection mode. In this mode, the protection circuit 304 releases an ESD current from the pad 306 to the pad 308 and de-activates the core circuit 302. When there is no ESD event, the protection circuit 304 enters a normal mode. In this mode, the protection circuit 304 directs the core circuit 302 to work normally. In this embodiment, the protection circuit 304 comprises a detection circuit 310, a current discharge element 312, transistors 314 and 316, and inverting circuits 318 and 324. Since the features of the detection circuit 310, the current discharge element 312, and the transistors 314 and 316 are the same as the features of the detection circuit 110, the current discharge element 112, and the transistors 114 and 116 in FIG. 1, the descriptions of the features of the detection circuit 310, the current discharge element 312, and the transistors 314 and 316 are omitted.

The inverting circuits 318 and 324 are connected in series and between the detection circuit 310 and the transistor 314 to process the control signal V2 and generates a control signal V5. In this embodiment, the inverting circuits 318 and 324 form a buffer circuit to increase the driving capability of the control signal V2. In this case, the driving capability of the control signal V5 is larger than the driving capability of the control signal V2. The number of inverting circuits is not limited in the present disclosure. In other embodiments, the protection circuit 304 comprises even inverting circuits.

In this embodiment, the inverting circuit 318 is coupled between the pads 306 and 308 and is configured to invert the control signal V2 to generate a control signal V4. In this case, the level of the control signal V4 is the same as the level of the detection signal V1. As shown in FIG. 3, the inverting circuit 318 comprises an N-type transistor 320 and a P-type transistor 322. The source of the P-type transistor 322 is coupled to the pad 306. The drain of the P-type transistor 322 serves as an output terminal of the inverting circuit 318 to output the control signal V4. The gate of the P-type transistor 322 serves as an input terminal of the inverting circuit 318 to receive the control signal V2. The source of the N-type transistor 320 is coupled to the pad 308. The drain of the N-type transistor 320 is coupled to the drain of the P-type transistor 322. The gate of the N-type transistor 320 is coupled to the gate of the P-type transistor 322.

The inverting circuit 324 is coupled between the pads 306 and 308 and is configured to invert the control signal V4 to generate the control signal V5. In this case, the level of the control signal V5 is the same as the level of the control signal V2. As shown in FIG. 3, the inverting circuit 324 comprises an N-type transistor 326 and a P-type transistor 328. The source of the P-type transistor 328 is coupled to the pad 306. The drain of the P-type transistor 328 serves as an output terminal of the inverting circuit 324 and outputs the control signal V5 to the gate of the transistor 314. The gate of the P-type transistor 328 serves as an input terminal of the inverting circuit 324 to receive the control signal V4. The source of the N-type transistor 326 is coupled to the pad 308. The drain of the N-type transistor 326 is coupled to the drain of the P-type transistor 328. The gate of the N-type transistor 326 is coupled to the gate of the P-type transistor 328.

Figure 4:
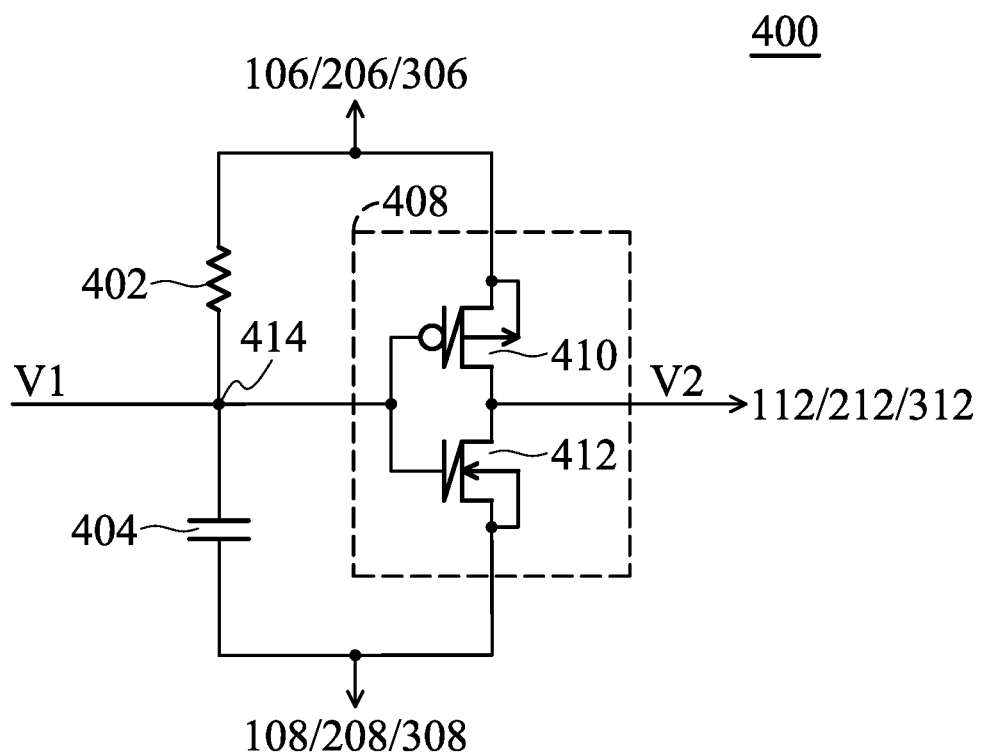
FIG. 4 is a schematic diagram of an exemplary embodiment of a detection circuit according to various aspects of the present disclosure.

FIG. 4 is a schematic diagram of an exemplary embodiment of a detection circuit, according to various aspects of the present disclosure. The detection circuit 400 comprises a resistor 402, a capacitor 404, and an inverting circuit 408. In this embodiment, the detection circuit 400 can serve as the detection circuit 110 of FIG. 1, the detection circuit 210 of FIG. 2, and the detection circuit 310 of FIG. 3. For brevity, assume that the detection circuit 400 serves as the detection circuit 110 of FIG. 1.

The resistor 402 is coupled between the pad 106 and a common node 414. The capacitor 404 is coupled between the common node 414 and the pad 108. In this embodiment, the level of the common node 414 serves as a detection signal V1. In some embodiments, the common node 414 is directly connected to the input terminal of the inverting circuit 218 of FIG. 2.

When an ESD event occurs in the pad 106 and the pad 108 is coupled to ground, the level (serving as the detection signal V1) of the common node 414 is a low level. When the pad 106 receives a first operation voltage (e.g., 3.3V) and the pad 108 receives a second operation voltage (e.g., 0V), the level of the common node 414 is a high level. In other embodiments, the resistor 402 and the capacitor 404 may be connected in series between the pads 206 and 208 of FIG. 2 or between the pads 306 and 308 of FIG. 3.

The inverting circuit 408 inverts the detection signal V1 to generate the control signal V2. In this embodiment, the input terminal of the inverting circuit 408 is coupled to the common node 414. The output terminal of the inverting circuit 408 is coupled to the current discharge element 112 of FIG. 1 to provide the control signal V2 to the current discharge element 112. In this case, the output terminal of the inverting circuit 408 may be directly connected to the gate of the transistor 114 of FIG. 1. In other embodiment, the output terminal of the inverting circuit 408 may be connected to the current discharge element 212 in FIG. 2 or the current discharge element 312 in FIG. 3.

The structure of inverting circuit 408 is not limited in the present disclosure. Any circuit can serve as the inverting circuit 408, as long as the circuit is capable of inverting the detection signal V1. In this embodiment, the inverting circuit 408 comprises a P-type transistor 410 and an N-type transistor 412. The gate of the P-type transistor 410 serves as the input terminal of the inverting circuit 408 to receive the detection signal V1. The source of the P-type transistor 410 is coupled to the pad 106. The drain of the P-type transistor 410 serves as the output terminal of the inverting circuit 408 to output the control signal V2. The gate of the N-type transistor 412 is coupled to the gate of the P-type transistor 410. The drain of the N-type transistor 412 is coupled to the drain of the P-type transistor 410. The source of the N-type transistor 412 is coupled to the pad 108. In some embodiment, the inverting circuit 408 is coupled between the pads 206 and 208 in FIG. 2 or between the pads 306 and 308 in FIG. 3.

Figure 5:
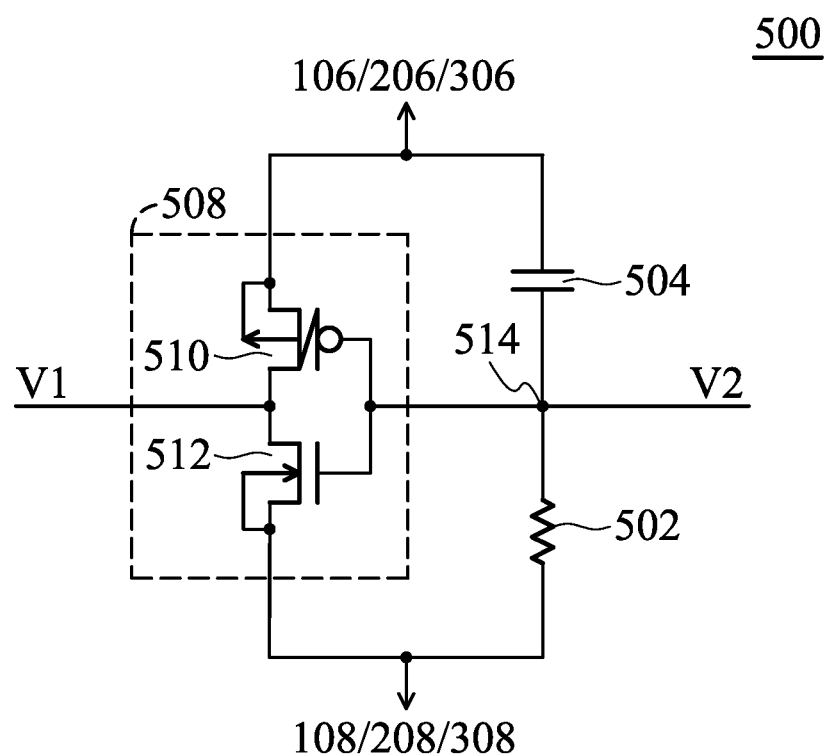
FIG. 5 is a schematic diagram of another exemplary embodiment of the detection circuit according to various aspects of the present disclosure.

FIG. 5 is a schematic diagram of another exemplary embodiment of the detection circuit according to various aspects of the present disclosure. The detection circuit 500 comprises a resistor 502, a capacitor 504, and an inverting circuit 508. In this embodiment, the detection circuit 500 can serve as the detection circuit 110 of FIG. 1, the detection circuit 210 of FIG. 2, and the detection circuit 310 of FIG. 3. For brevity, assume that the detection circuit 500 serves as the detection circuit 110 of FIG. 1.

The capacitor 504 is coupled between the pad 106 and a common node 514. The resistor 502 is coupled between the common node 514 and the pad 108. In this embodiment, the level of the common node 514 serves as a control signal V2. When an ESD event occurs in the pad 106 and the pad 108 is coupled to ground, the level (serving as the control signal V2) of the common node 514 is a high level. When the pad 106 receives a first operation voltage (e.g., 3.3V) and the pad 108 receives a second operation voltage (e.g., 0V), the level of the common node 514 is a low level. In other embodiment, the capacitor 504 and the resistor 502 may be connected in series between the pads 206 and 208 in FIG. 2 or between the pads 306 and 308 in FIG. 3.

The inverting circuit 508 inverts the control signal V2 to generate the detection signal V1. In this embodiment, the input terminal of the inverting circuit 508 is coupled to the common node 514. The output terminal of the inverting circuit 508 is coupled to the gate of the transistor 116 of FIG. 1. In other embodiments, the output terminal of the inverting circuit 508 may be coupled to the input terminal of the inverting circuit 218 of FIG. 2.

In this embodiment, the inverting circuit 508 comprises a P-type transistor 510 and an N-type transistor 512. The gate of the P-type transistor 510 serves as the input terminal of the inverting circuit 508 to receive the control signal V2. The source of the P-type transistor 510 is coupled to the pad 106. The drain of the P-type transistor 510 serves as the input terminal of the inverting circuit 508 to output the detection signal V1. The gate of the N-type transistor 512 is coupled to the gate of the P-type transistor 510. The drain of the N-type transistor 512 is coupled to the drain of the P-type transistor 510. The source of the N-type transistor 512 is coupled to the pad 108. In some embodiments, the inverting circuit 508 is coupled between the pads 206 and 208 in FIG. 2 or between the pads 306 and 308 in FIG. 3.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). For example, it should be understood that the system, device and method may be realized in software, hardware, firmware, or any combination thereof. Therefore, the scope of the appended claims should be accorded the broadest interpretation so as to encompass all such modifications and similar arrangements.

What is claimed is:

1. A protection circuit for preventing an electrostatic discharge (ESD) current from entering a core circuit, comprising:
    a detection circuit coupled between a first pad and a second pad to detect ESD events and comprising a resistor, a capacitor and a first inverting circuit, wherein in response to an ESD event, the detection circuit sets a detection signal to a predetermined level;
    a current discharge element coupled between the first and second pads, wherein in response to the detection signal being at the predetermined level, the current discharge element is turned on so that the ESD current passes through the current discharge element;
    a first transistor coupled between the core circuit and the second pad;
    a second transistor coupled between the first transistor and the second pad, wherein in response to the detection signal being at the predetermined level, the second transistor is turned on to turn off the first transistor; and
    a second inverting circuit coupled between the detection circuit and the second transistor,
    wherein the resistor is coupled to the capacitor in series between the first and second pads, and the first inverting circuit is coupled between the first and second pads.

2. The protection circuit protection device as claimed in claim 1, wherein
    the resistor is coupled between the first pad and a common node;
    the capacitor is coupled between the common node and the second pad; and
    the first inverting circuit comprises a first input terminal and a first output terminal, wherein the first input terminal is coupled to the common node, and the first output terminal is coupled to the current discharge element.

3. The protection circuit protection device as claimed in claim 2, wherein:
    the first transistor comprises a first gate receiving the detection signal, a first electrode coupled to the core circuit, and a second electrode coupled to the second pad, and
    the second transistor comprises a second gate, a third electrode coupled to the first gate, and a fourth electrode coupled to the second pad.

4. The protection circuit protection device as claimed in claim 3, wherein in response to the second transistor being turned on, a voltage of the first gate is equal to a voltage of the second pad.

5. The protection circuit protection device as claimed in claim 3,
    wherein the second inverting circuit comprises a second input terminal and a second output terminal, wherein the second input terminal is coupled to the common node, and the second output terminal is coupled to the second gate.

6. The protection circuit protection device as claimed in claim 3, further comprising:
 a third inverting circuit comprising a third input terminal and a third output terminal, wherein the second inverting circuit comprises a second input terminal and a second output terminal, the second input terminal is coupled to the first output terminal, and the third input terminal is coupled to the second output terminal, and the third output terminal is coupled to the second gate.

7. The protection circuit protection device as claimed in claim 1, wherein each of the current discharge element, the first transistor, and the second transistor is an N-type transistor.

8. The protection circuit protection device as claimed in claim 1, wherein in response to the first pad receiving a first operation voltage and the second pad receiving a second operation voltage, the core circuit operates normally, the first transistor is turned on, and the second transistor is turned off.

9. The protection circuit protection device as claimed in claim 1, wherein in response to the first pad receiving a first operation voltage and the second pad receiving a second operation voltage, the detection circuit sets the detection signal so that it is not equal to the predetermined level.

10. An operation circuit, comprising:
 a core circuit coupled to a first pad; and
 a protection circuit to prevent an electrostatic discharge (ESD) current from entering the core circuit, comprising:
  a detection circuit coupled between the first pad and a second pad to detect ESD events and comprising a resistor, a capacitor and a first inverting circuit, wherein in response to an ESD event, the detection circuit sets the detection signal to a predetermined level;
  a current discharge element coupled between the first and second pads, wherein in response to the detection signal being at the predetermined level, the current discharge element is turned on so that the ESD current passes through the current discharge element;
  a first transistor coupled between the core circuit and the second pad;
  a second transistor coupled between the first transistor and the second pad, wherein in response to the detection signal being at the predetermined level, the second transistor is turned on to turn off the first transistor; and
  a second inverting circuit coupled between the detection circuit and the second transistor,
 wherein the resistor is coupled to the capacitor in series between the first and second pads, and the first inverting circuit is coupled between the first and second pads.

11. The operation circuit as claimed in claim 10, wherein the resistor is coupled between the first pad and a common node;
 the capacitor is coupled between the common node and the second pad; and
 the first inverting circuit comprises a first input terminal and a first output terminal, wherein the first input terminal is coupled to the common node, and the first output terminal is coupled to the current discharge element.

12. The operation circuit as claimed in claim 11, wherein:
 the first transistor comprises a first gate receiving the detection signal, a first electrode coupled to the core circuit, and a second electrode coupled to the second pad, and
 the second transistor comprises a second gate, a third electrode coupled to the first gate, and a fourth electrode coupled to the second pad.

13. The operation circuit as claimed in claim 12, wherein in response to the second transistor being turned on, a voltage of the first gate is equal to a voltage of the second pad.

14. The operation circuit as claimed in claim 12,
 wherein the second inverting circuit comprises a second input terminal and a second output terminal, wherein the second input terminal is coupled to the common node, and the second output terminal is coupled to the second gate.

15. The operation circuit as claimed in claim 12, further comprising:
 a third inverting circuit comprising a third input terminal and a third output terminal, wherein the second inverting circuit comprises a second input terminal and a second output terminal, the second input terminal is coupled to the first output terminal, the third input terminal is coupled to the second output terminal, and the third output terminal is coupled to the second gate.

16. The operation circuit as claimed in claim 10, wherein each of the current discharge element, the first transistor, and the second transistor is an N-type transistor.

17. The operation circuit as claimed in claim 10, wherein in response to the first pad receiving a first operation voltage and the second pad receiving a second operation voltage, the core circuit operates normally, the first transistor is turned on, and the second transistor is turned off.

18. The operation circuit as claimed in claim 10, wherein in response to the first pad receiving a first operation voltage and the second pad receiving a second operation voltage, the detection circuit sets the detection signal so that it is not equal to the predetermined level.

* * * * *